(12) United States Patent
Choi

(10) Patent No.: US 8,980,721 B2
(45) Date of Patent: Mar. 17, 2015

(54) RESISTIVE MEMORY DEVICE AND METHOD OF FABRICATING THE SAME

(71) Applicant: Electronics and Telecommunications Research Institute, Daejeon (KR)

(72) Inventor: Sung-Yool Choi, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 196 days.

(21) Appl. No.: 13/690,286

(22) Filed: Nov. 30, 2012

(65) Prior Publication Data

US 2013/0089965 A1    Apr. 11, 2013

Related U.S. Application Data

(62) Division of application No. 12/773,228, filed on May 4, 2010, now Pat. No. 8,344,344.

(30) Foreign Application Priority Data

Dec. 4, 2009 (KR) .................... 10-2009-0119776

(51) Int. Cl.
*H01L 29/72* (2006.01)
*H01L 45/00* (2006.01)
*H01L 27/24* (2006.01)

(52) U.S. Cl.
CPC .............. *H01L 45/00* (2013.01); *H01L 27/24* (2013.01)
USPC ............... 438/382; 257/2; 365/148; 365/163

(58) Field of Classification Search
CPC .................................................... H01L 45/00
USPC .......................... 438/382; 257/2; 365/148, 163
See application file for complete search history.

(56) References Cited

U.S. PATENT DOCUMENTS

| | | | |
|---|---|---|---|
| 7,446,352 B2 | 11/2008 | Becker et al. | |
| 2005/0226068 A1 | 10/2005 | Brandon et al. | |
| 2008/0278990 A1 | 11/2008 | Kumar et al. | |
| 2009/0184305 A1* | 7/2009 | Lee et al. | 257/2 |

FOREIGN PATENT DOCUMENTS

| | | |
|---|---|---|
| JP | 2004-185756 A | 7/2004 |
| KR | 10-0429083 B1 | 4/2004 |
| KR | 10-0530908 | 11/2005 |
| KR | 10-0687187 A | 2/2007 |
| KR | 10-1213702 B1 | 12/2012 |

* cited by examiner

*Primary Examiner* — Edward Wojciechowicz
(74) *Attorney, Agent, or Firm* — Rabin & Berdo, P.C.

(57) ABSTRACT

Provided are resistive memory devices and methods of fabricating the same. The resistive memory devices and the methods are advantageous for high integration because they can provide a multilayer memory cell structure. Also, the parallel conductive lines of adjacent layers do not overlap each other in the vertical direction, thus reducing errors in program/erase operations.

6 Claims, 17 Drawing Sheets

RESISTIVE MEMORY DEVICE AND METHOD OF FABRICATING THE SAME

CROSS-REFERENCE TO RELATED APPLICATIONS

This is a divisional of co-pending U.S. application Ser. No. 12/773,228, filed May 4, 2010. This U.S. non-provisional patent application also claims priority under 35 U.S.C. §119 of Korean Patent Application No. 10-2009-0119776, filed on Dec. 4, 2009, the entire contents of which are hereby incorporated by reference.

BACKGROUND OF THE INVENTION

The present invention disclosed herein relates to nonvolatile memory devices and methods of fabricating the same, and more particularly, to resistive memory devices and methods of fabricating the same.

Examples of semiconductor memory devices used widely in recent years include Dynamic Random Access Memory (DRAM) devices, Static RAM (SRAM) devices, and flash memory devices. The semiconductor memory devices may be classified into volatile memory devices and nonvolatile memory devices. The volatile memory devices lose data stored in memory cells, when power supply thereto is interrupted. Examples of the volatile memory devices include DRAM devices and SRAM devices. The nonvolatile memory devices retain data stored in memory cells, even when power supply thereto is interrupted. Examples of the nonvolatile memory devices include flash memory devices.

Flash memory devices are mainly used for data storage in digital cameras, MP3 players, portable phones, etc. in order to store data even without power supply thereto. However, since the flash memory devices are configured to accumulate electric charges in floating gates by high electric fields, they have a complex cell structure, which causes an obstacle to high integration. Examples of the next-generation semiconductor memory devices for overcoming the above limitation include Ferroelectric RAM (FRAM) devices, Magnetic RAM (MRAM) devices, Phase-change RAM (PRAM) devices, and Resistive RAM (RRAM) devices.

SUMMARY OF THE INVENTION

Embodiments of the present invention provide resistive memory devices advantageous for high integration and methods of fabricating the same.

In some embodiments of the present invention, resistive memory devices include: a substrate; first conductive lines disposed over the substrate to be parallel to each other and extend in a first direction; second conductive lines disposed over the first conductive lines to be parallel to each other and extend in a second direction across the first direction; third conductive lines disposed over the second conductive lines to be parallel to each other and extend in the first direction; a first data storage layer disposed between the first conductive line and the second conductive line; and a second data storage layer disposed between the second conductive line and the third conductive line, wherein the third conductive line does not overlap the first conductive line in the vertical direction.

In some embodiments, the resistive memory devices further include fourth conductive lines disposed over the third conductive lines to be parallel to each other and extend in the second direction, wherein the fourth conductive line does not overlap the second conductive line in the vertical direction.

In other embodiments, the resistive memory devices further include: $n^{th}$ conductive lines disposed over the fourth conductive lines to be insulated from the fourth conductive lines and extend in the first direction; and $(n+1)^{th}$ conductive lines disposed over the $n^{th}$ conductive lines to be insulated from the $n^{th}$ conductive lines and extend in a third direction, wherein 'n' is a natural number greater than or equal to 5, one of the $n^{th}$ conductive lines overlaps the first conductive line in the vertical direction, and one of the $(n+1)^{th}$ conductive lines overlaps the second conductive line in the vertical direction.

In further embodiments, the first and second data storage layers include a metal oxide layer. Herein, the first to third conductive lines may include a metal that has a higher oxygen affinity than the metal of the first and second data storage layers. The first to third conductive lines may include aluminum or an alkali metal.

In still further embodiments, the first and second data storage layers include a metal that react with one of the first to third conductive lines to form an oxide layer. Herein, the thickness of the oxide layer may vary by the voltage applied to at least one of the conductive lines.

In still further embodiments, the number of charge trap sites in the first and second data storage layers varies by the voltage applied to at least one of the conductive lines.

In still further embodiments, the first and second data storage layers are disposed over the substrate.

In still further embodiments, the first data storage layer is disposed overly at the intersection of the first conductive line and the second conductive line, and the second data storage layer is disposed overly at the intersection of the second conductive line and the third conductive line. Herein, the first and second data storage layers may include an N-type metal oxide, and the resistive memory devices may further include: a first P-type pattern disposed between the first data storage layer and the first conductive line; and a second P-type pattern disposed between the second data storage layer and the second conductive line.

In still further embodiments, the resistive memory devices further include: a first diffusion barrier layer disposed between the first data storage layer and the first conductive line; and a second diffusion barrier layer disposed between the second data storage layer and the second conductive line.

In still further embodiments, the first and second data storage layers have a plurality of conductive states according to the voltage applied to at least one of the conductive lines.

In still further embodiments, the first and second conductive lines and the first data storage layer therebetween constitute a first layer of first memory cells, and the second and third conductive lines and the second data storage layer therebetween constitute a second layer of second memory cells.

In other embodiments of the present invention, methods of fabricating a resistive memory device include: forming first conductive lines on a substrate such that the first conductive lines are parallel to each other and extend in a first direction; forming a first data storage layer on the first conductive lines; forming second conductive lines on the first data storage layer such that the second conductive lines are parallel to each other and extend in a second direction across the first direction; forming a second data storage layer on the second conductive lines; and forming third conductive lines on the second data storage layer such that the third conductive lines are parallel to each other and extend in the first direction, wherein the third conductive line does not overlap the first conductive line in the vertical direction.

In some embodiments, the first and second data storage layers react with the second and third conductive lines to form an oxide layer. The oxide layer may be formed simultaneously with the forming of the second and third conductive lines.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
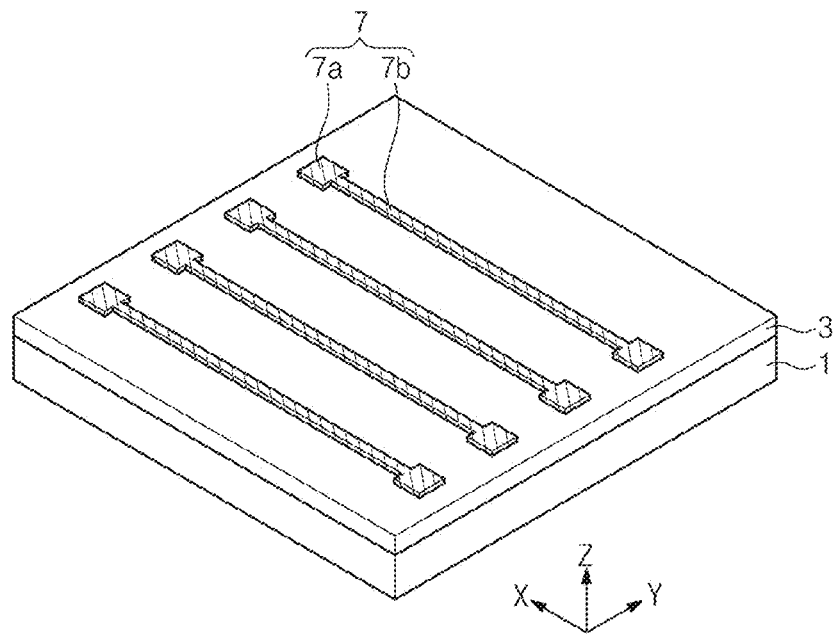
FIGS. 1 to 7 are perspective views illustrating a sequential process of fabricating a resistive memory device according to an exemplary embodiment 1 of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the specification.

In the specification, it will be understood that when a layer (or film) is referred to as being "on" another layer or substrate, it can be directly on the other layer or substrate, or intervening layers may also be present. It will also be understood that although the terms first, second and third are used herein to describe various layers or steps (or operations), these layers or steps should not be limited by these terms. These terms are used only to discriminate one layer or step from another layer or step.

In the following description, the technical terms are used only for explaining specific exemplary embodiments while not limiting the present invention. The terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components.

Also, the embodiments in the detailed description will be described with reference to sectional views or plan views as ideal exemplary views of the present invention. In the drawings, the dimensions of layers and regions are exaggerated for clarity of illustration. Accordingly, shapes of the exemplary views may be modified according to fabrication techniques and/or allowable errors. Therefore, the embodiments of the present invention are not limited to the specific shape illustrated in the exemplary views, but may include other shapes that may be created according to fabrication processes. For example, an etched region illustrated as a rectangle may have rounded or curved features. Areas exemplified in the drawings have general properties, and are used to illustrate specific shapes of device regions. Thus, these should not be construed as limiting the scope of the present invention.

Hereinafter, resistive memory devices and methods of fabricating the same according to exemplary embodiments of the present invention will be described in detail with reference to the accompanying drawings.

Embodiment 1

FIGS. 1 to 7 are perspective views illustrating a sequential process of fabricating a resistive memory device according to an exemplary embodiment 1 of the present invention.

Referring to FIG. 1, a dielectric layer 3 is formed on a substrate 1. The substrate 1 may include a semiconductor substrate formed of silicon, or may include a plastic substrate formed of polyethersulfone (PES), poly(ethylene terephthalte (PET), polycarbonate (PC), or Polyimide (PI). The dielectric layer 3 may include a silicon oxide layer, a silicon nitride layer, or an organic polymer-based dielectric layer. The dielectric layer 3 may be used as a dielectric interlayer. A transistor may be formed on the substrate 1 before the forming of the dielectric layer 3. A plurality of first conductive lines 7 are formed on the dielectric layer 3, which are parallel to each other and extend in a first direction. Each of the first conductive lines 7 may include pad portions 7a at both ends thereof and a line portion 7b between the pad portions 7a. The pad portions 7a may be wider than the line portion 7b, and a voltage may be applied to at least one of the pad portions 7a. The first conductive lines 7 may be formed of at least one of transition metal, conductive transition metal nitride, conductive ternary nitride, and alkali metal. For example, the first conductive lines 7 may include metallic material such as aluminum (Al), copper (Cu), aurum (Au) and platinum (Pt), transparent material such as indium tin oxide (ITO), or doped polysilicon. The forming of the first conductive lines 7 may include forming a conductive layer over the substrate 1 and etching the resulting structure. In another exemplary embodiment, the first conductive lines 7 may be formed through an ink-jet process using conductive ink.

Figure 2:
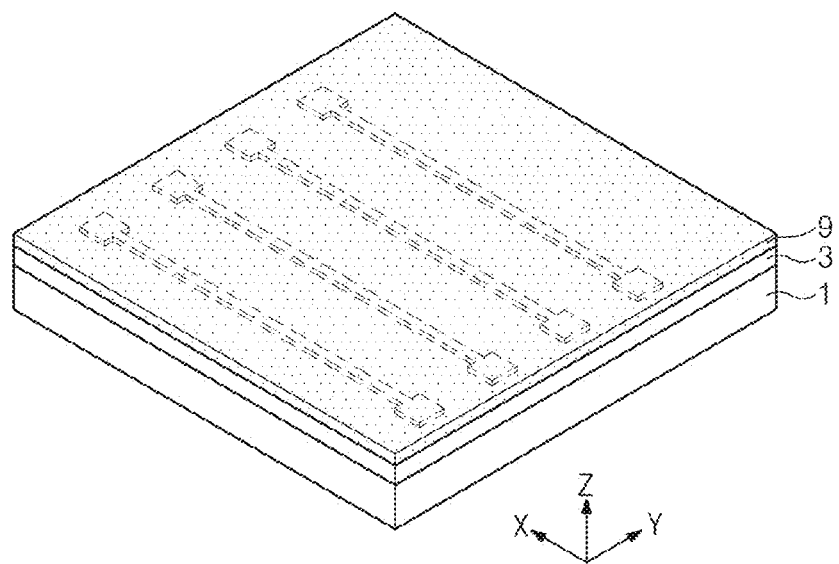

Referring to FIG. 2, a first data storage layer 9 is formed over the substrate 1 including the first conductive lines 7. The first data storage layer 9 may be formed of a material capable of forming an oxide layer by reacting with the metal of second conductive lines that will be formed in the subsequent process. The first data storage layer 9 may include a titanium oxide layer. The titanium oxide layer may be formed at temperatures of less than about 250° C. through a chemical vapor deposition (CVD) process or an atomic layer deposition (ALD) process. Since a memory cell array of each layer is formed at low temperatures, it does not affect a memory cell operation of the lower layer.

Figure 3:
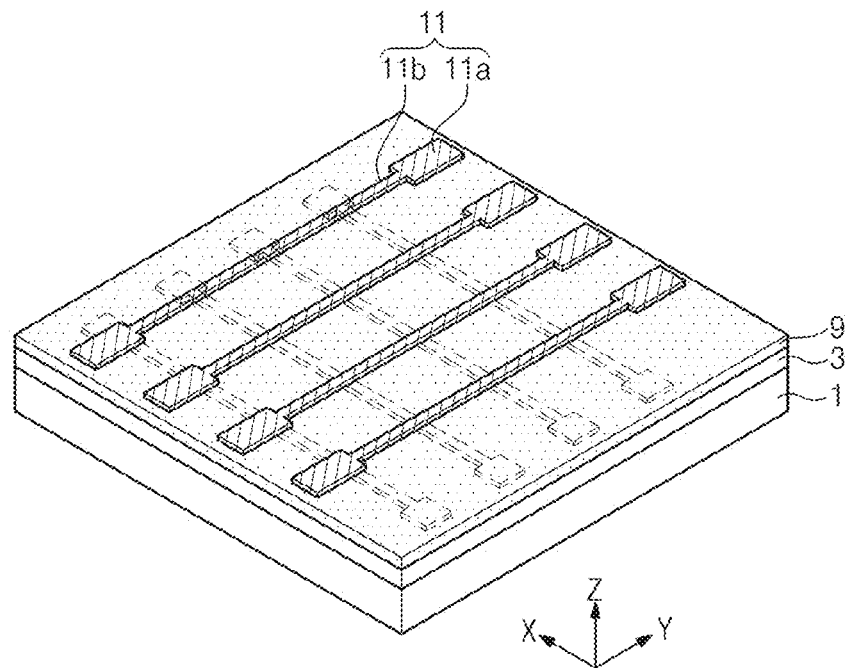

Referring to FIG. 3, a plurality of second conductive lines 11 are formed on the first data storage layer 9, which are parallel to each other and extend in a second direction across the second direction. Each of the second conductive lines 11 may include pad portions 11a at both ends thereof and a line portion 11b between the pad portions 11a. The second conductive lines 11 may include a metal that has a higher oxygen affinity than the metal (e.g., titanium) of the first data storage layer 9. For example, the second conductive lines 11 may include aluminum or alkali metal. The forming of the second conductive lines 11 may include forming a conductive layer over the substrate 1 and etching the resulting structure. In another exemplary embodiment, the second conductive lines 11 may be formed through an ink-jet process using conductive ink. In the forming of the second conductive lines 11, the oxygen of the first data storage layer 9 is separated/restored from the titanium by the process temperature and the high oxygen affinity metal of the second conductive lines 11 to combine with the metal of the second conductive lines 11, thereby forming a metal oxide layer at the interface between the first data storage layer 9 and the second conductive lines 11. The first conductive lines 7, the second conductive lines 11 and the first data storage layer 9 therebetween may constitute a first layer of memory cells. That is, one memory cell may be formed at the intersection of the first conductive lines 7 and the second conductive lines 11.

Figure 4:
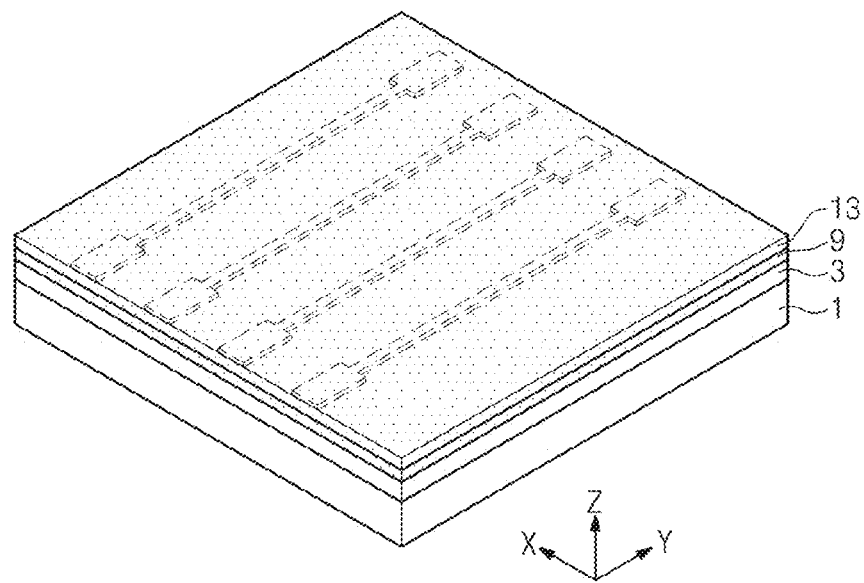

Referring to FIG. 4, a second data storage layer 13 is formed over the substrate 1 including the second conductive lines 11. The second data storage layer 13 may be formed of a material capable of forming an oxide layer by reacting with the metal of third conductive lines that will be formed in the subsequent process. The second data storage layer 13 may include a titanium oxide layer. The titanium oxide layer may be formed at temperatures of less than about 250° C. through a CVD process or an ALD process.

Figure 5:
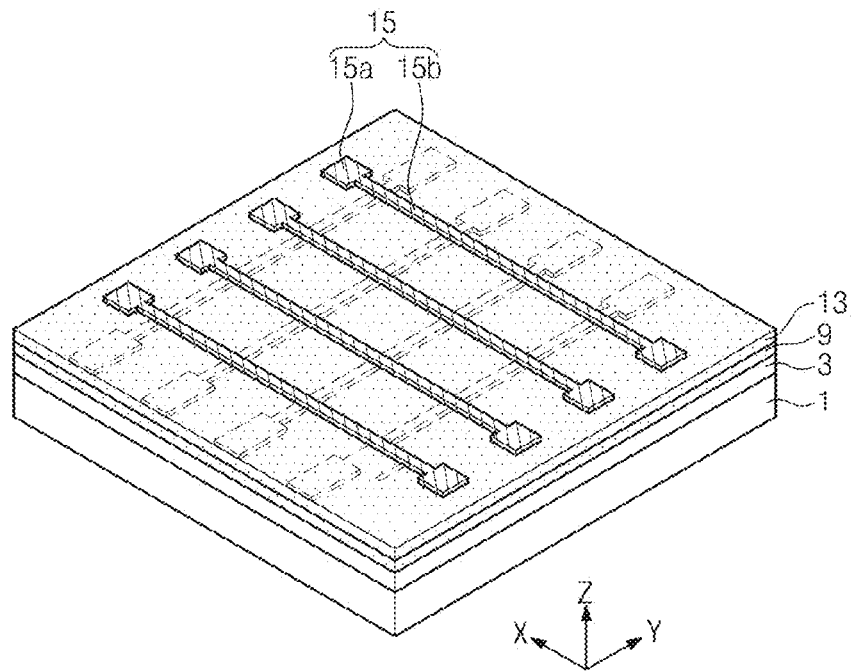

Referring to FIG. 5, a plurality of third conductive lines 15 are formed on the second data storage layer 13, which are parallel to each other and extend in the first direction. Each of the third conductive lines 15 may include pad portions 15a at both ends thereof and a line portion 15b between the pad portions 15a. The third conductive lines 15 do not overlap the first conductive lines 7 in a third direction across the first and second directions, for example, in the vertical direction. Thus, the distance between the first conductive lines 7 and the third conductive lines 15 becomes greater than that of the case where the third conductive lines 15 overlap the first conductive lines 7 in the vertical direction. Accordingly, it is possible to reduce the mutual influence between the first conductive lines 7 and the third conductive lines 15, which is caused by a voltage applied to the first conductive lines 7 or the third conductive lines 15. The second conductive lines 11, the second data storage layer 13 and the third conductive lines 15 may constitute a second layer of memory cells.

Figure 6:
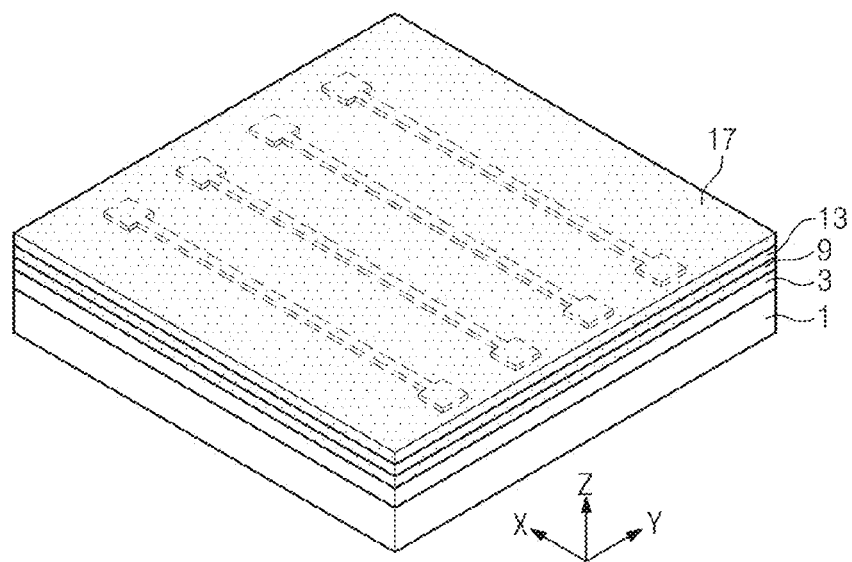

Referring to FIG. 6, a third data storage layer 17 is formed to cover the third conductive lines 15. The third data storage layer 17 may be formed of a material capable of forming an oxide layer by reacting with the metal of fourth conductive lines that will be formed in the subsequent process. The third data storage layer 17 may include a titanium oxide layer. The titanium oxide layer may be formed at temperatures of less than about 250° C. through a CVD process or an ALD process.

Figure 7:
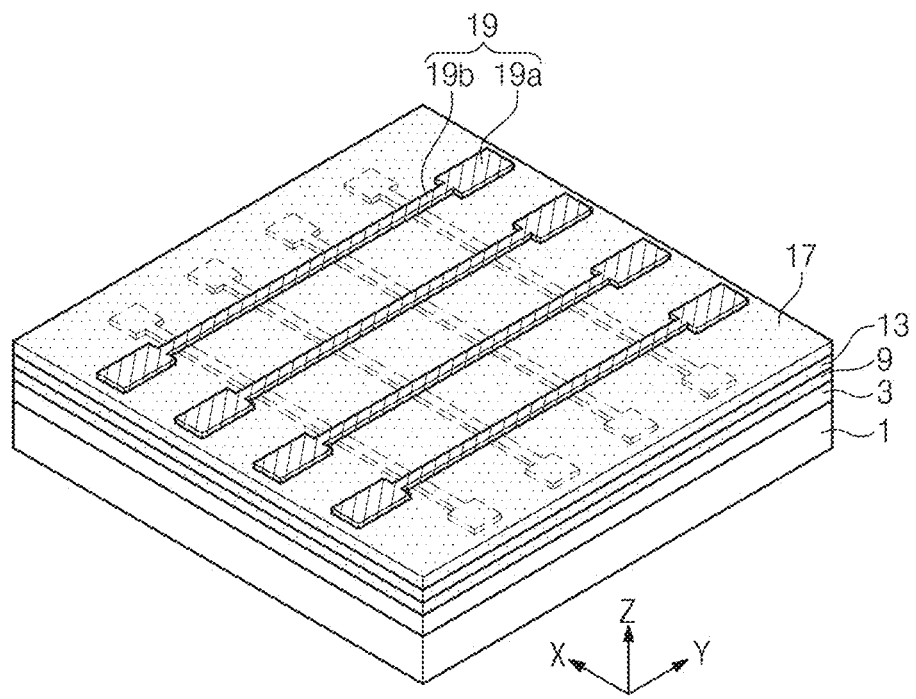

Referring to FIG. 7, a plurality of fourth conductive lines 19 are formed on the third data storage layer 17, which are parallel to each other and extend in the second direction. Each of the fourth conductive lines 19 may include pad portions 19a at both ends thereof and a line portion 19b between the pad portions 15a. The fourth conductive lines 19 do not overlap the second conductive lines 11 in the vertical direction (i.e., the third direction). Thus, the distance between the second conductive lines 11 and the fourth conductive lines 19 becomes greater than that of the case where the fourth conductive lines 19 overlap the second conductive lines 11 in the vertical direction. Accordingly, it is possible to reduce the mutual influence between the second conductive lines 11 and the fourth conductive lines 19, which is caused by a voltage applied to the second conductive lines 11 or the fourth conductive lines 19. The third conductive lines 15, the third data storage layer 17 and the fourth conductive lines 19 may constitute a third layer of memory cells.

Figure 8:
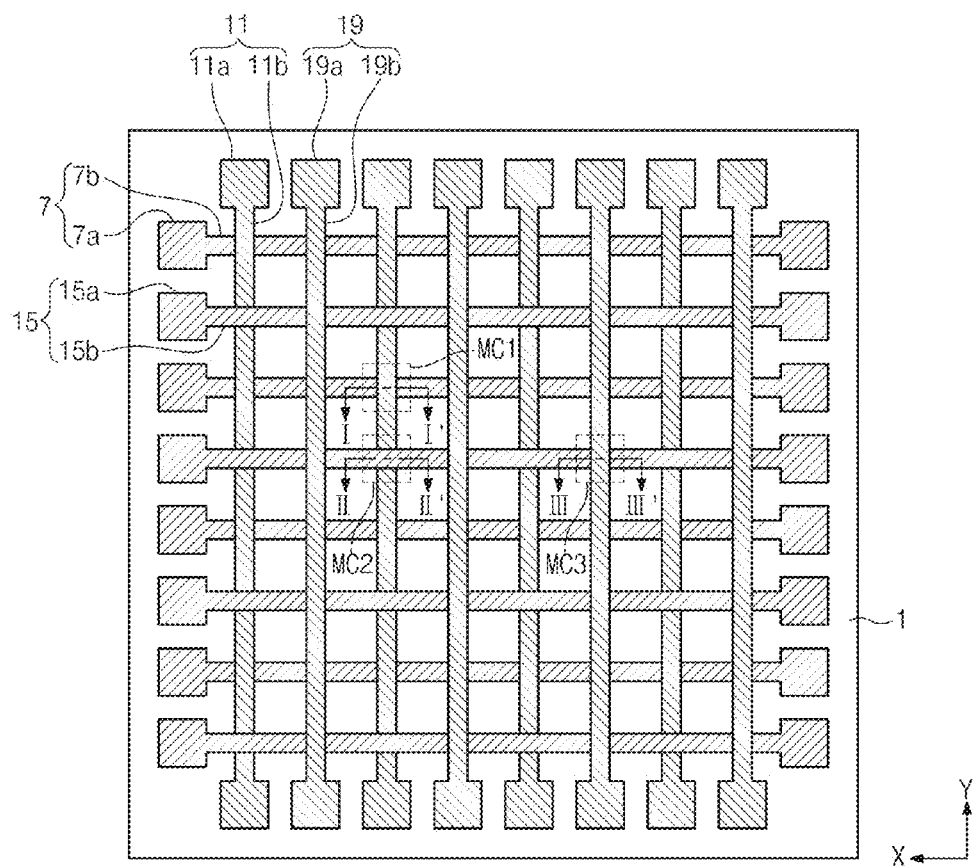
FIG. 8 is a plan view of a resistive memory device according to an exemplary embodiment 1 of the present invention.

FIG. 8 is a plan view of the resistive memory device fabricated through the process of the FIGS. 1 to 7.

Figure 9A:
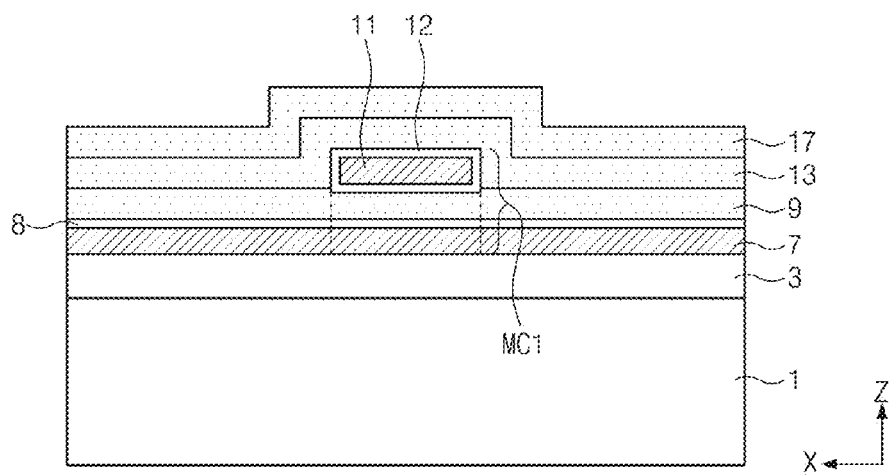
FIGS. 9A, 9B and 9C are sectional views taken along lines I-I, II-II and III-III of FIG. 8 according to an exemplary embodiment 1 of the present invention.
Figure 9B:
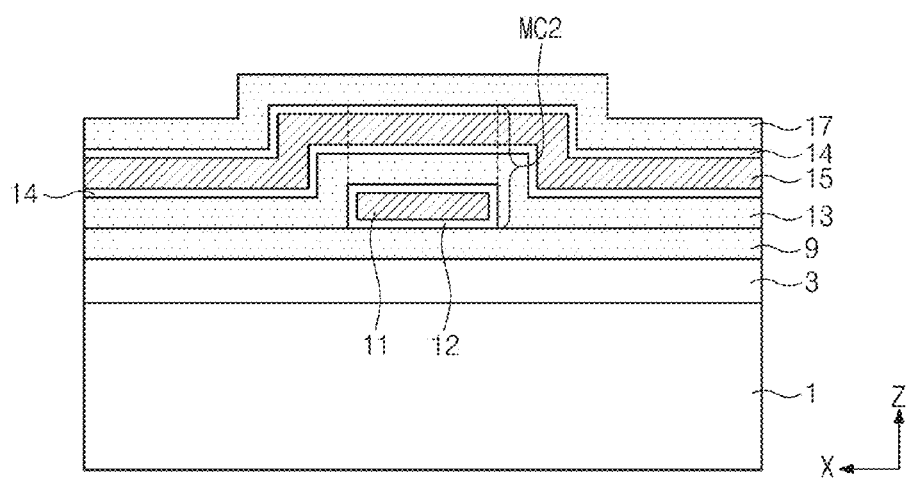
Figure 9C:
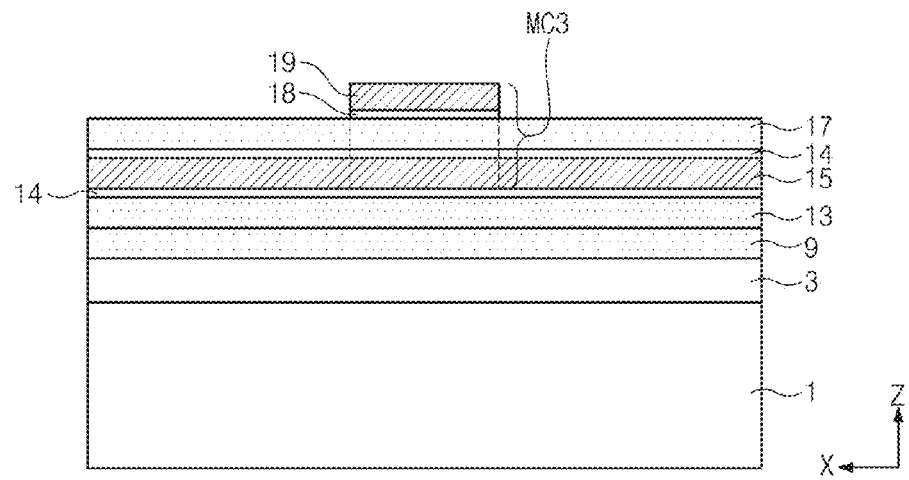

FIGS. 9A, 9B and 9C are sectional views taken along lines I-I, II-II and III-III of FIG. 8 according to an exemplary embodiment 1 of the present invention.

Referring to FIGS. 9A, 9B and 9C, first to fourth conductive lines 7, 11, 15 and 19 include a metal that has a higher oxygen affinity than the metal of the data storage layers 9, 13 and 17. Accordingly, oxide layers 12, 14 and 18 may be formed between the data storage layers 9, 13 and 17 and the first to fourth conductive lines 7, 11, 15 and 19. For example, the oxide layers 12, 14 and 18 may include an aluminum oxide layer or an oxide of alkali metal.

Referring to FIGS. 8 and 9A, a dielectric layer 3 is disposed over a substrate 1 and first conductive lines 7 are disposed over the dielectric layer 3 to extend in the first direction. A first data storage layer 9 is disposed over the first conductive lines 7, and second conductive lines 11 are disposed over the first data storage layer 9 to extend in the second direction. A first layer of unit memory cells MC1, including the first conductive lines 7, the second conductive lines 11 and the first data storage layer 9, is formed at the intersection of the first conductive lines 7 and the second conductive lines 11. A second data storage layer 13 is disposed over the second conductive lines 11. A second oxide layer 12 is disposed between the second conductive lines 11 and the first and second data storage layers 9 and 13.

Referring to FIGS. 8 and 9B, third conductive lines 15 are disposed over the second data storage layer 13 to extend in the first direction. The third conductive lines 15 do not overlap the first conductive lines 7. A second layer of unit memory cells MC2, including the second conductive lines 11, the third conductive lines 15 and the second data storage layer 13, is formed at the intersection of the second conductive lines 11 and the third conductive lines 15. That is, the second conductive lines 11 may be used as second conductive lines in the first layer of the unit memory cells MC1, and may be used as first conductive lines in the second layer of the unit memory cells MC2.

Referring to FIGS. 8 and 9C, a third data storage layer 17 is disposed over the third conductive lines 15 and fourth conductive lines 19 are disposed over the third data storage layer 17 to extend in the second direction. The fourth conductive lines 19 do not overlap the second conductive lines 11 in the vertical direction. A third layer of unit memory cells MC3, including the third conductive lines 15, the fourth conductive lines 19 and the third data storage layer 17, is formed at the intersection of the third conductive lines 15 and the fourth conductive lines 19.

Although not illustrated in the drawings, an $m^{th}$ data storage layer may be disposed over the fourth conductive lines 19 and $n^{th}$ conductive lines may be disposed over the $m^{th}$ data storage layer. Herein, 'm' is a natural number greater than or equal to 4 and 'n' is an odd number greater than or equal to 5. One of the $n^{th}$ conductive lines may overlap the first conductive lines 7 in the vertical direction. One of the $(n+1)^{th}$ conductive lines may overlap the second conductive lines 11 in the vertical direction.

In this manner, memory cells may be stacked in a multi-layer structure. Accordingly, it is possible to provide a semiconductor device that is highly integrated while minimizing the electrical interference of each layer.

Embodiment 2

Figure 10A:
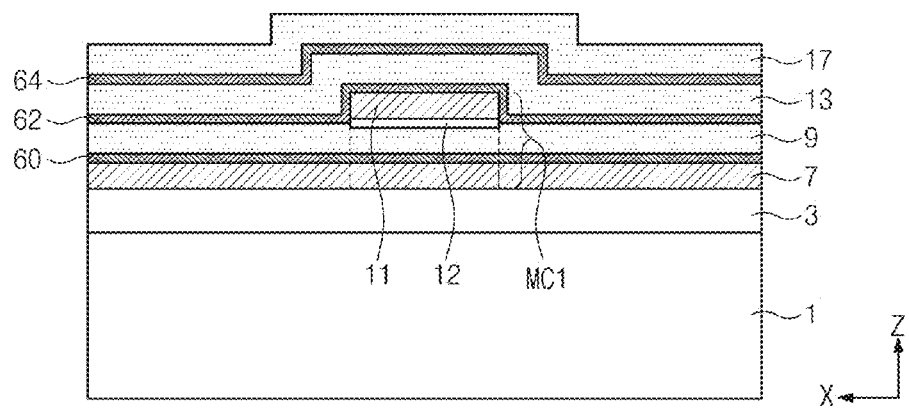
FIGS. 10A, 10B and 10C are sectional views taken along lines I-I, II-II and III-III of FIG. 8 according to an exemplary embodiment 2 of the present invention.
Figure 10B:
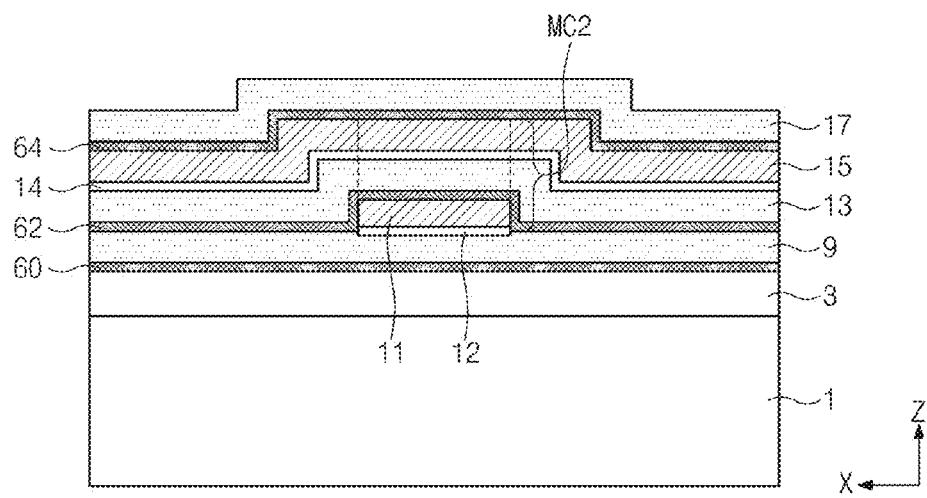
Figure 10C:
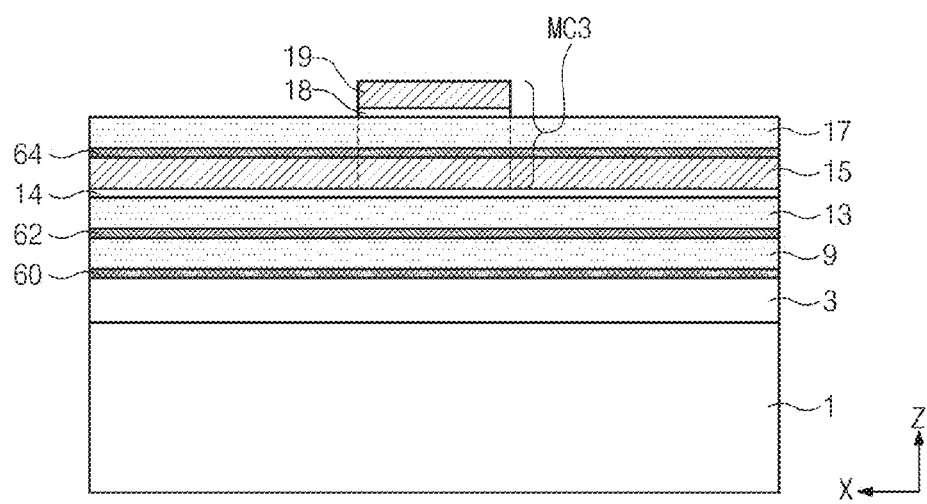

FIGS. 10A, 10B and 10C are sectional views taken along lines I-I, II-II and III-III of FIG. 8 according to an exemplary embodiment 2 of the present invention.

Referring to FIGS. 10A, 10B and 10C, a diffusion barrier layer 60/62/64 is disposed under a data storage layer 9/13/17. The diffusion barrier layer 60/62/64 may prevent a charge trap (i.e., a space charge), which is formed in the data storage layer 9/13/17, from diffusing into a conductive line 7/11/15 disposed under the diffusion barrier layer 60/62/64. However, the diffusion barrier layers 60, 62 and 64 may be sufficiently thin so as not to restrict the tunneling effects. The diffusion barrier layers 60, 62 and 64 may have a thickness of about 1 nm to about 10 nm. The diffusion barrier layers 60, 62 and 64 may include a dielectric layer. The diffusion barrier layers 60, 62 and 64 may have a dielectric constant of about 3 to about 10. For example, the diffusion barrier layers 60, 62 and 64 may include an aluminum oxide or a silicon oxide.

The other structures may be the same as those of the exemplary embodiment 1 described with reference to FIGS. 9A, 9B and 9C.

Embodiment 3

Figure 11A:
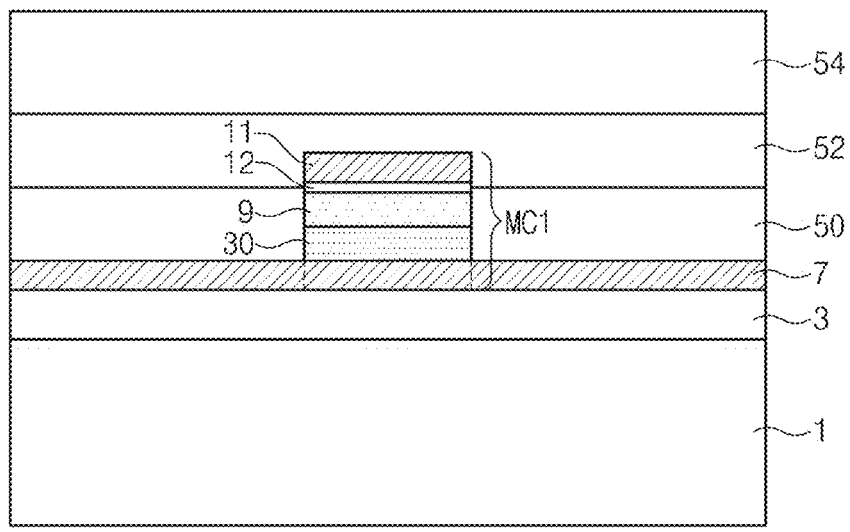
FIGS. 11A, 11B and 11C are sectional views taken along lines I-I, II-II and III-III of FIG. 8 according to an exemplary embodiment 3 of the present invention.
Figure 11B:
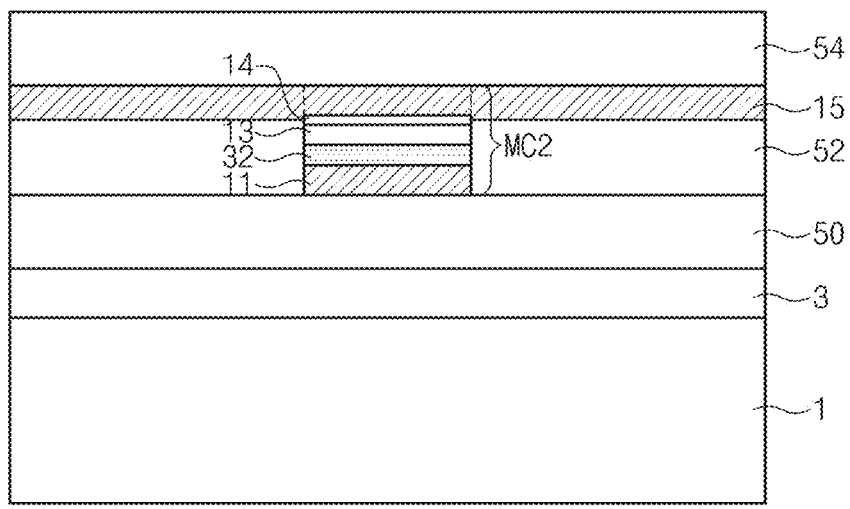
Figure 11C:
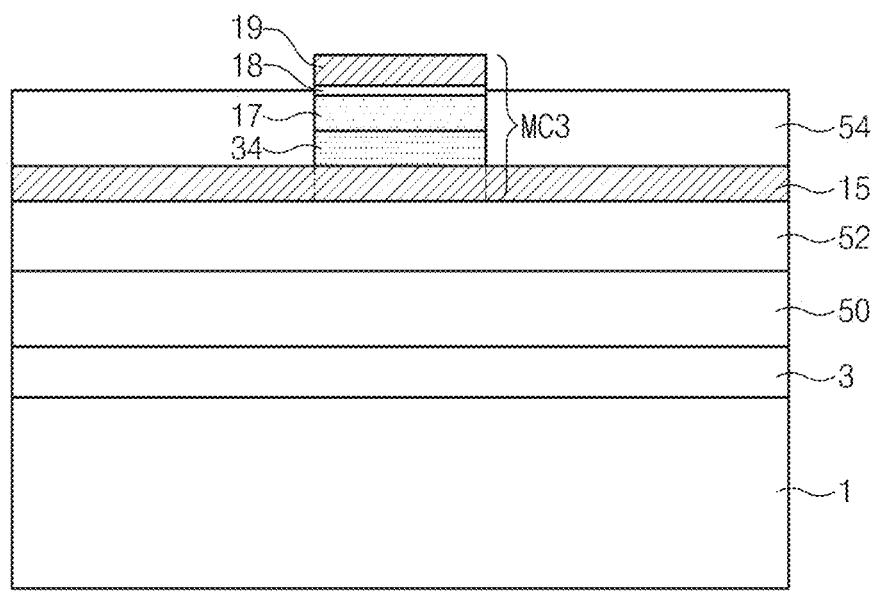

FIGS. 11A, 11B and 11C are sectional views taken along lines I-I, II-II and III-III of FIG. 8 according to an exemplary embodiment 3 of the present invention.

Referring to FIGS. 11A, 11B and 11C, data storage layers 9, 13 and 17 are disposed overly at the intersection of conductive lines 7, 11, 15 and 19. In this case, it is possible to further prevent the operational errors between the memory cells adjacent to each other. Also, the data storage layers 9, 13 and 17 may include an N-type metal oxide layer. A P-type material layer 30/32/34 may be disposed between the data storage layer 9/13/17 and the conductive line 7/11/15 disposed under the data storage layer 9/13/17. For example, the data storage layers 9, 13 and 17 may include an N-type metal oxide layer formed of at least one selected from the group consisting of $TiO_2$, $SnO_2$, ZnO, CdO, MnO, and FeO. The P-type material layers 30, 32 and 34 may be formed of at least one selected from the group consisting of $CuAlO_2$, NiO, MnO, $In_2O_3$, CoO, $Cu_2O$, $MnFe_2O_4$, and $NiFe_2O_4$. The P-type material layer 30/32/34 and the N-type data storage layer 9/13/17 may form a PN diode to serve as a switch that passes a current only in the forward direction. Accordingly, it is possible to interrupt a leakage current to the memory cell adjacent to the selected memory cell. Dielectric interlayers are disposed between the conductive lines 7, 11, 15 and 19, not at the intersection of the conductive lines 7, 11, 15 and 19.

Exemplary Experiment 1

In the exemplary experiment 1, a resistive memory device including only a first layer of memory cells MC1 of FIG. 8 was fabricated. In order to fabricate the resistive memory device, a first conductive line (corresponding to 7 of FIG. 9A) is formed of an aluminum layer on a polyimide substrate. Thereafter, a data storage layer (corresponding to 9 of FIG. 9A) is formed of a titanium oxide layer on the first conductive line through an ALD process. Thereafter, a second conductive line (corresponding to 11 of FIG. 9A) is formed of an aluminum layer on the data storage layer. At this point, an aluminum oxide layer was formed between the first conductive line and the data storage layer and between the second conductive line and the data storage layer. Accordingly, a single-layer memory cell was formed. Thereafter, a current change was measured while applying a voltage to each conductive line, which is shown in FIG. 12A.

Figure 12A:
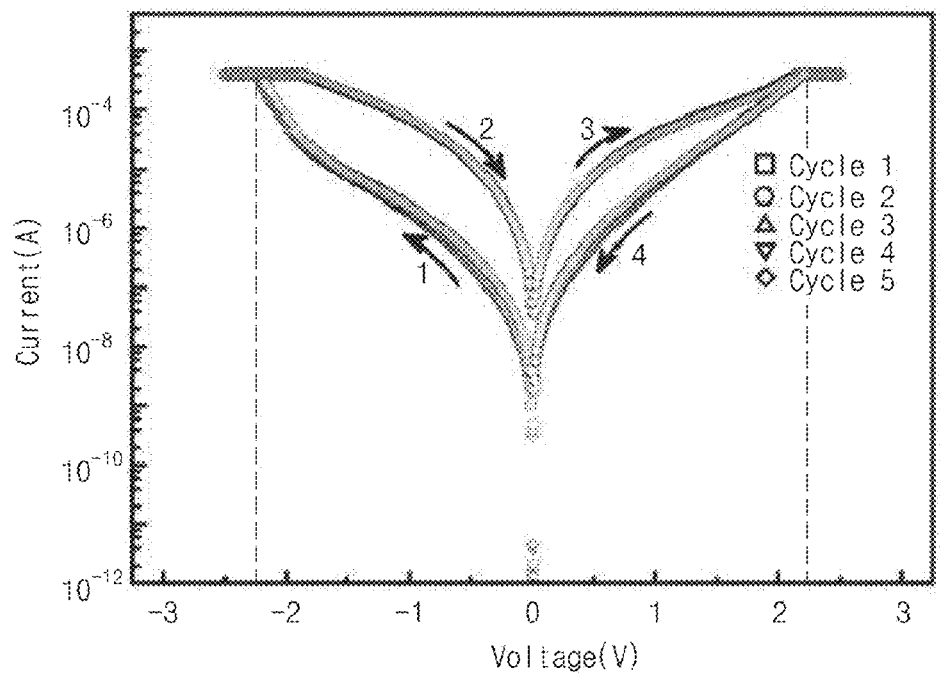
FIG. 12A is a graph illustrating the current-voltage characteristics of a resistive memory device with a single-layer memory cell structure according to an exemplary experiment 1 of the present invention.

Referring to FIG. 12A, a ground voltage is applied to the first conductive line and a negative voltage is applied to the second conductive line. As the absolute value of the negative voltage increases, the current sensed in the resistive memory device changes along a curve 1. In this case, the thickness of the aluminum oxide layer between the second conductive line and the data storage layer may decrease gradually. On the other hand, the number of charge trap sites in the data storage layer may decrease. When the voltage becomes lower than a voltage level Vreset1 of about −2V, the resistive memory device changes from OFF state to ON state. Thereafter, when the absolute value of the negative voltage applied to the second conductive line decreases, the current sensed in the resistive memory device changes along a curve 2. When the voltage applied to the second conductive line changes into a negative voltage, the sensed current changes along a curve 3. When the voltage becomes higher than a voltage level Vreset2 of about 4V, the resistive memory device changes from ON state to OFF state. Thereafter, when the voltage decreases, the current changes along a curve 4. The same occurs even when the cycle repeats five or more times. The graph of FIG. 12A illustrates the electrical conductivity of two different states under the same voltage. The curves 2 and 3 show a high-conductivity state (i.e., an ON state), and the curves 1 and 4 show a low-conductivity state (i.e., an OFF state). These states can be seen from FIG. 12B.

Figure 12B:
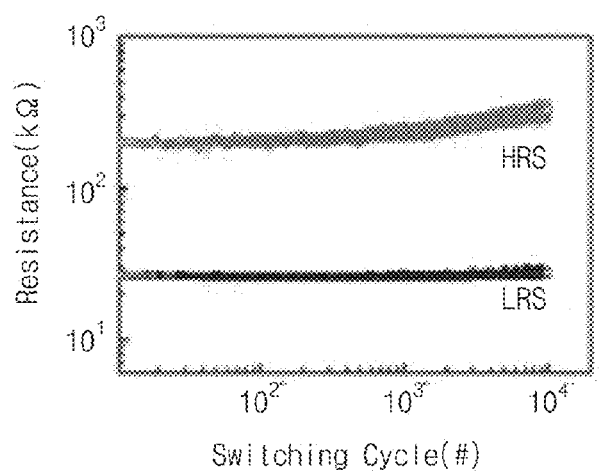
FIG. 12B is a graph illustrating the resistance states depending on the switching cycles of a resistive memory device with a single-layer memory cell structure according to an exemplary experiment 2 of the present invention.

It can be seen from FIG. 12B that the resistive memory device according to the exemplary experiment 1 exhibits a high-resistance state (HRS) and a low-resistance state (LRS) that are constant independent of the number of times of switching. Accordingly, it is possible to implement a resistive nonvolatile memory device with good characteristics.

Exemplary Experiment 2

Figure 13:
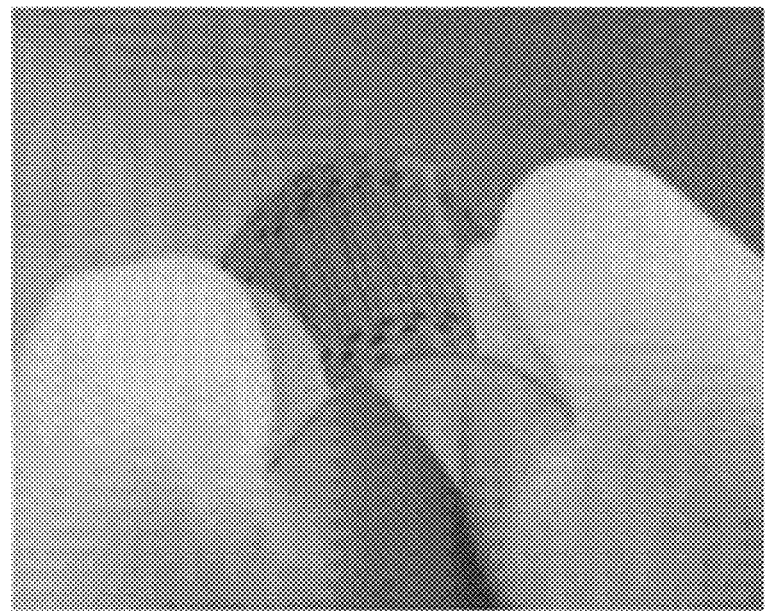
FIG. 13 is a picture of the resistive memory device with a two-layer memory cell structure according to the exemplary experiment 2.

In the exemplary experiment 2, a resistive memory device with a two-layer memory cell structure was fabricated. First, like in the exemplary experiment 1, first and second conductive lines were formed. Thereafter, a second data storage layer (corresponding to 13 of FIG. 9B) was formed of a titanium oxide layer on the second conductive lines, and third conductive lines (corresponding to 15 of FIG. 9B) were formed of an aluminum layer on the second data storage layer. Accordingly, a resistive memory device including a first layer of memory cells MC1 and a second layer of memory cells MC2 was fabricated, the picture of which is shown in FIG. 13. FIG. 13 shows the picture of a resistive memory device that is flexible and transparent and includes conductive lines that do not overlap each other.

Figure 14A:
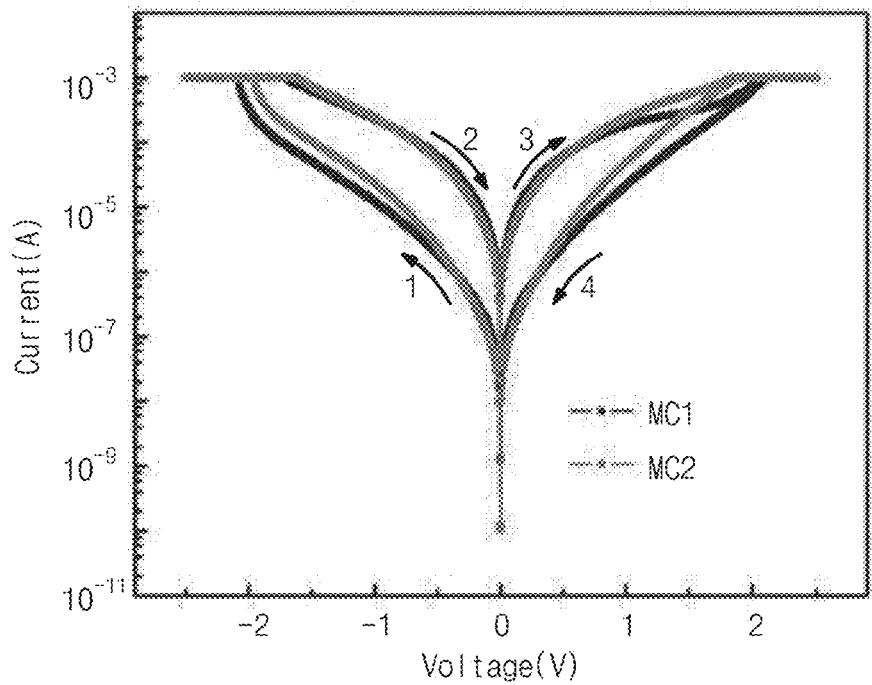
FIG. 14A is a graph illustrating the current-voltage characteristics of each layer of memory cells in the resistive memory device with a two-layer memory cell structure according to the exemplary experiment 2.

FIG. 14A is a graph illustrating the current-voltage characteristics of the resistive memory device of FIG. 13 when voltages are applied to each layer of memory cells MC1 and MC2 as in the exemplary experiment 1. Referring to FIG. 14A, it can bee seen that similar patterns appear even in different layers.

Figure 14B:
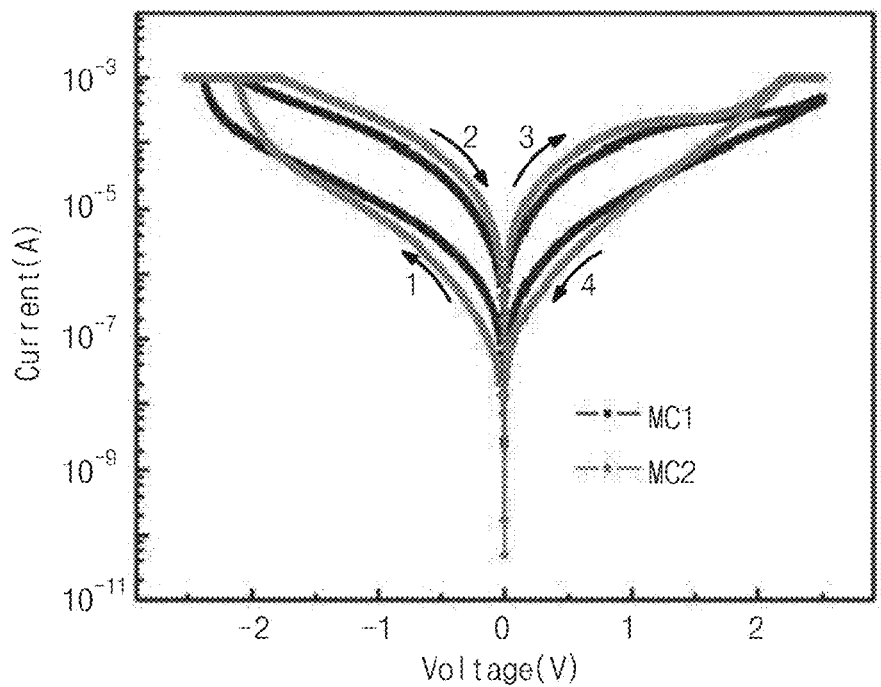
FIG. 14B is a graph illustrating the current-voltage characteristics of each layer of memory cells after bending the resistive memory device with a two-layer memory cell structure 100 times according to the exemplary experiment 2.

FIG. 14B is a graph illustrating the current-voltage characteristics of the resistive memory device of FIG. 13 when voltages are applied to each layer of memory cells MC1 and MC2 as in the exemplary experiment 1 after bending the resistive memory device 100 times. Referring to FIG. 14B, it can be seen that the resistive memory device maintains its original memory characteristics without substantial change even when it is bent 100 times.

FIGS. 15A to 15D are graphs illustrating the influence of an operation of each layer on an adjacent layer in the resistive memory device of FIG. 13.

Figure 15A:
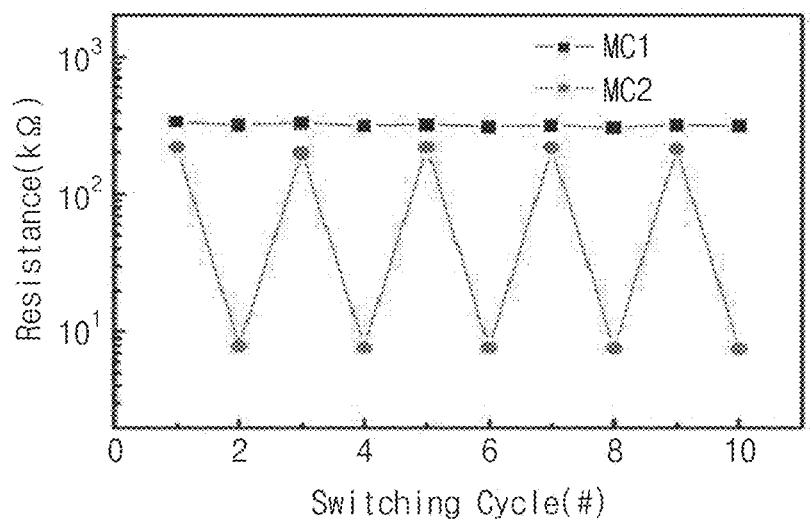
FIGS. 15A to 15D are graphs illustrating the influence of each layer of memory cells on another layer of memory cells in a resistive memory device with a two-layer memory cell structure according to another example of the present invention.

FIG. 15A illustrates a resistance change in each layer when the memory cell MC2 of the second layer is turned on/off while the memory cell MC1 of the first layer maintains an OFF state. Referring to FIG. 15A, it can be seen that the memory cell MC1 of the first layer maintains an OFF state even when the memory cell MC2 of the second layer is turned on/off several times.

Figure 15B:
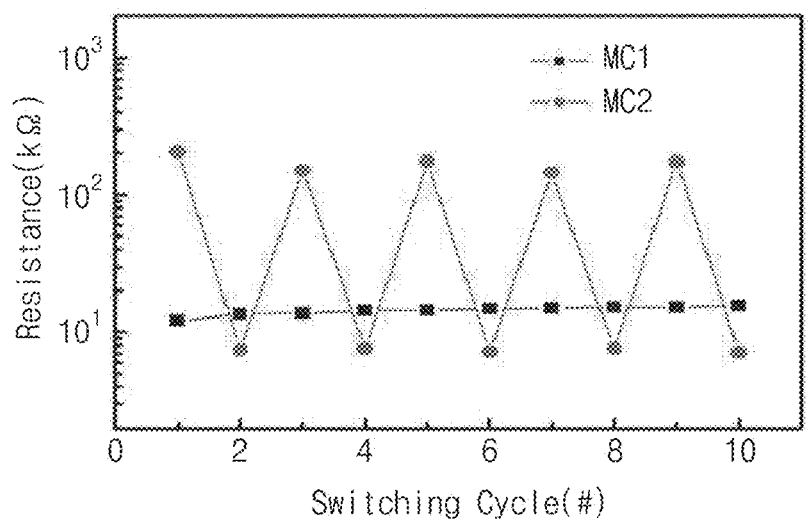

FIG. 15B illustrates a resistance change in each layer when the memory cell MC2 of the second layer is turned on/off while the memory cell MC1 of the first layer maintains an ON state. Referring to FIG. 15B, it can be seen that the memory cell MC1 of the first layer maintains an ON state even when the memory cell MC2 of the second layer is turned on/off several times.

Figure 15C:
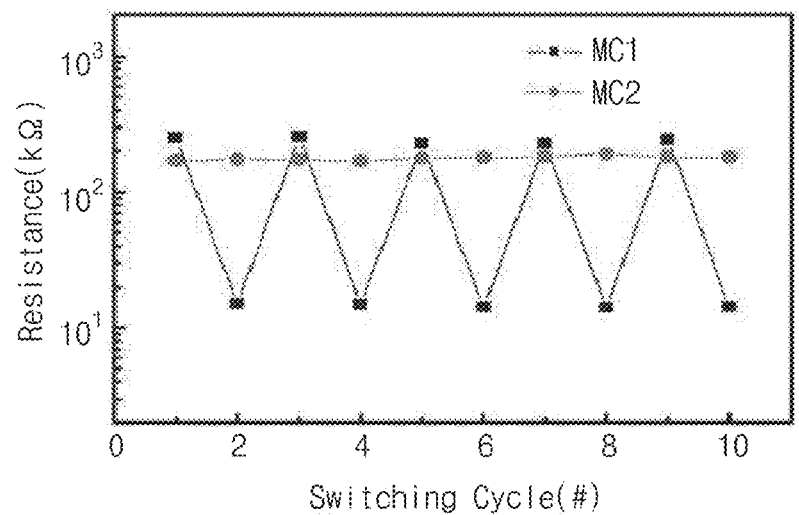

FIG. 15C illustrates a resistance change in each layer when the memory cell MC1 of the first layer is turned on/off while the memory cell MC2 of the second layer maintains an OFF state. Referring to FIG. 15C, it can be seen that the memory cell MC2 of the second layer maintains an OFF state even when the memory cell MC1 of the first layer is turned on/off several times.

Figure 15D:
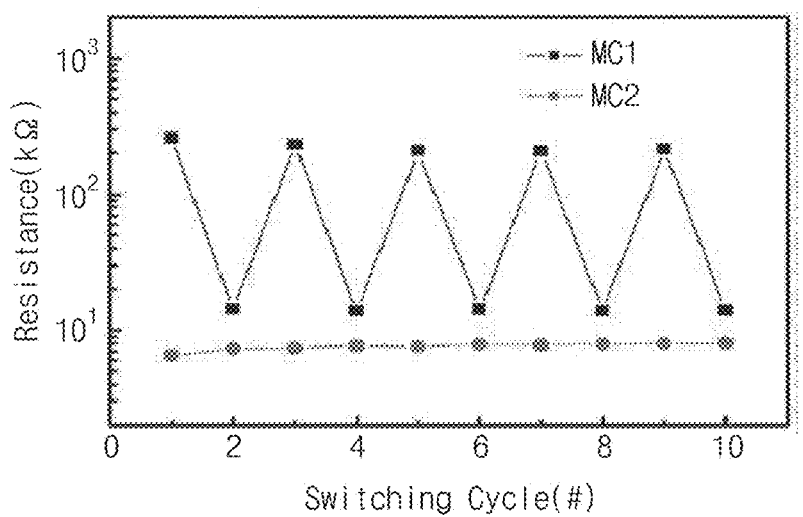

FIG. 15D illustrates a resistance change in each layer when the memory cell MC1 of the first layer is turned on/off while the memory cell MC2 of the second layer maintains an ON state. Referring to FIG. 15D, it can be seen that the memory cell MC2 of the second layer maintains an ON state even when the memory cell MC1 of the first layer is turned on/off several times.

Referring to FIGS. 15A to 15D, it can be seen that an operation of the memory cell of each layer does not affect an operation of the memory cell of an adjacent layer. This is because the conductive lines, which are parallel to each other and are disposed over different layers, do not overlap each other in the vertical direction.

Figure 16A:
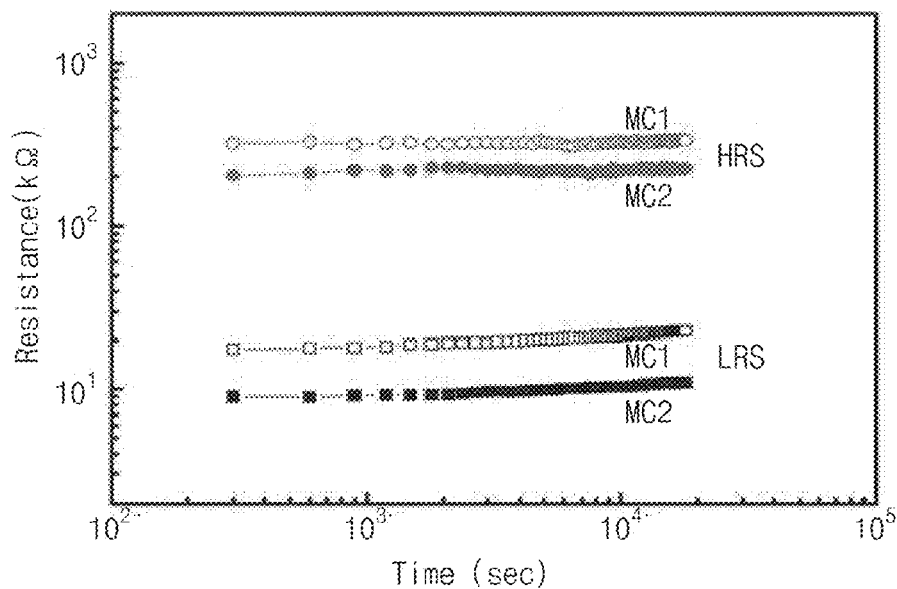
FIG. 16A is a graph illustrating the retention characteristics of the resistive memory device with a two-layer memory cell structure according to the exemplary experiment 2.

FIG. 16A is a graph illustrating the time-dependent resistance characteristics of each layer. Referring to FIG. 16A, it can be seen that each layer maintains its ON/OFF state even after the lapse of more than $2 \times 10^4$ sec. Therefore, it can be seen that the resistive memory devices of the present invention have good nonvolatile characteristics, i.e., good retention characteristics.

Figure 16B:
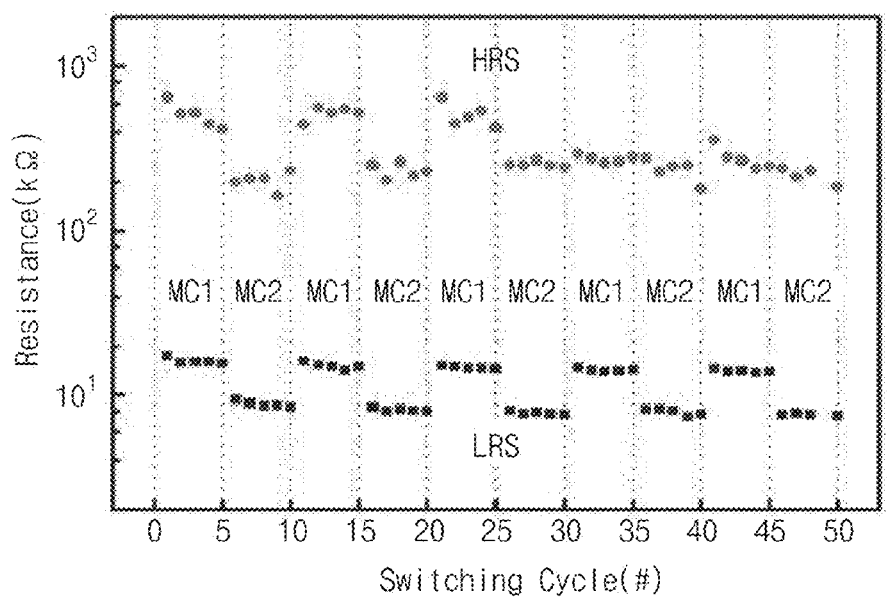
FIG. 16B is a graph illustrating the endurance characteristics of the resistive memory device with a two-layer memory cell structure according to the exemplary experiment 2.

FIG. 16B is a graph illustrating the resistance states of each layer when the memory cells of each layer are alternately turned on/off 50 or more times. Referring to FIG. 16B, it can be seen that each layer maintains its ON/OFF characteristics even when the memory cells of each layer are turned on/off about 50 or more times. Therefore, it can be seen that the resistive memory devices of the present invention have good nonvolatile characteristics, i.e., good endurance characteristics.

Exemplary Application

Figure 17:
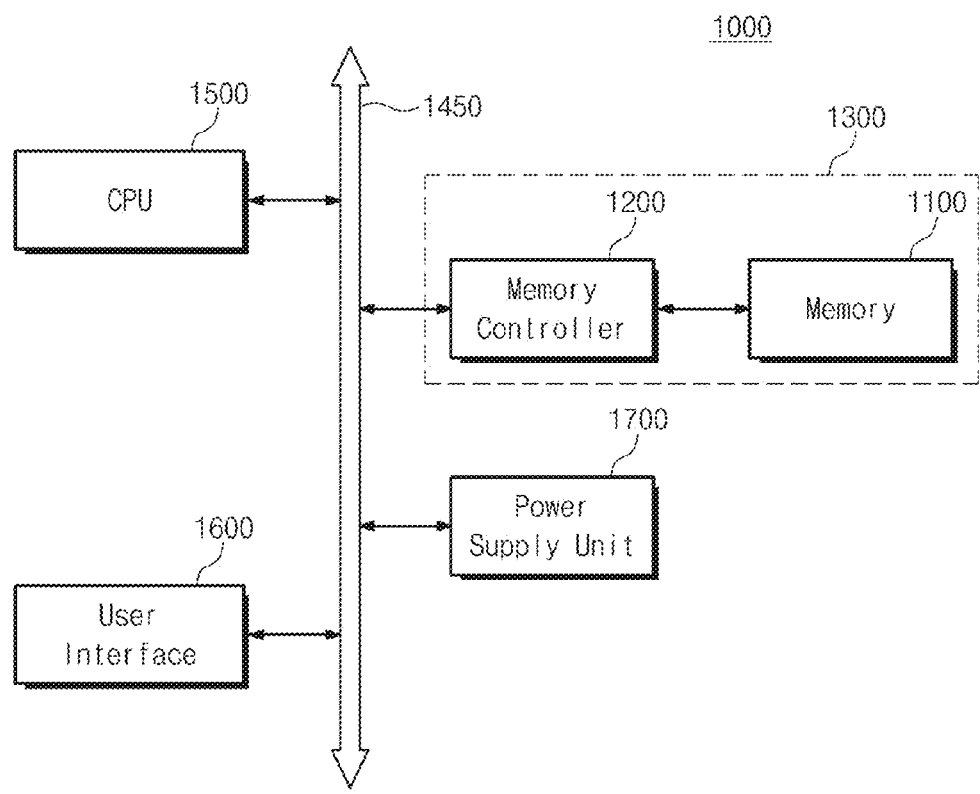
FIG. 17 is a block diagram of a memory system including a resistive memory device according to an exemplary embodiment of the present invention.

FIG. 17 is a block diagram of a memory system including a resistive memory device according to an exemplary embodiment of the present invention.

Referring to FIG. 17, a memory system 1000 according to an exemplary embodiment of present invention includes a semiconductor memory device 1300, a central processing unit (CPU) 1500, a user interface 1600, and a power supply unit 1700 that are connected electrically to a system bus 1450. The semiconductor memory device 1300 includes a nonvolatile memory device (e.g., a resistive memory device, such as an RRAM, according to the present invention) 1100 and a memory controller 1200.

Data, which are provided through the user interface 1600 or processed by the CPU 1500, may be stored in the nonvolatile memory device 1100 through the memory controller 1200. The nonvolatile memory device 1100 may be configured using a solid state disk (SSD). When the nonvolatile memory device 1100 is configured using an SSD, the operation speed of the memory system 1000 may increase remarkably.

Although not illustrated in FIG. 17, those skilled in the art will readily understand that the memory system 1000 may further include an application chipset, a camera image processor, and a mobile DRAM.

Also, the memory system 1000 may be applicable to PDAs, portable computers, web tablets, wireless phones, mobile phones, digital music players, memory cards, or any other devices capable of transmitting/receiving information in wireless environments.

Also, the nonvolatile memory device or the memory system according to the present invention may be mounted in various types of packages. Examples of the packages of the nonvolatile memory device or the memory system include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the resistive memory devices and the fabrication methods thereof according to the exemplary embodiments of the present invention are advantageous for high integration because they can provide a multilayer memory cell structure. Also, the parallel conductive lines of adjacent layers do not overlap each other in the vertical direction, thus making it possible to reduce errors in program/erase operations.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a resistive memory device, comprising:
    forming first conductive lines over a substrate such that the first conductive lines are parallel to each other and extend in a first direction;
    forming a first data storage layer on the first conductive lines;
    forming second conductive lines on the first data storage layer such that the second conductive lines are parallel to each other and extend in a second direction across the first direction;
    simultaneously with the forming of the second conductive lines, forming a first oxide layer between the second conductive lines and the first data storage layer by reacting the first data storage layer with the second conductive lines;
    forming a second data storage layer on the second conductive lines; and
    forming third conductive lines on the second data storage layer such that the third conductive lines are parallel to each other and extend in the first direction,
    simultaneously with the forming of the third conductive lines, forming a second oxide layer between the third conductive lines and the second data storage layer by reacting the second data storage layer with the third conductive lines;
    wherein the third conductive line does not overlap the first conductive line in the vertical direction.

2. The method of claim 1, wherein the first and second data storage layers comprise a metal oxide layer containing a first metal.

3. The method of claim 2, wherein the second and third conductive lines comprise a second metal that has a higher oxygen affinity than the first metal of the first and second data storage layers.

4. The method of claim 1, further comprising:
    forming a third data storage layer on the third conductive lines;
    forming fourth conductive lines on the third data storage layer such that the fourth conductive lines are parallel to each other and extend in the second direction; and
    simultaneously with the forming of the fourth conductive lines, forming a third oxide layer between the fourth conductive lines and the third data storage layer by reacting the second data storage layer with the third conductive lines,
    wherein the fourth conductive line does not overlap the second conductive line in the vertical direction.

5. The method of claim 3, wherein during the forming of the second conductive lines, an oxygen of the first data storage layer is separated from the first metal of the first data storage layer and then combined with the second metal of the second conductive lines, forming a metal oxide layer at an interface between the first data storage layer and the second conductive lines.

6. The method of claim 3, wherein during the forming of the third conductive lines, an oxygen of the second data storage layer is separated from the first metal of the second data storage layer and is then combined with the second metal of the third conductive lines, forming a metal oxide layer at an interface between the second data storage layer and the third conductive lines.

* * * * *